(12) United States Patent
Rahimo (10) Patent No.: US 11,264,376 B2
(45) Date of Patent: Mar. 1, 2022

(54) BIPOLAR SEMICONDUCTOR DEVICE AND METHOD FOR MANUFACTURING SUCH A SEMICONDUCTOR DEVICE

(71) Applicant: mqSemi AG, Zug (CH)

(72) Inventor: Munaf Rahimo, Gaensbrunnen (CH)

(73) Assignee: MQ SEMI AG, Zug (CH)

( * ) Notice: Subject to any disclaimer, the term of this patent is extended or adjusted under 35 U.S.C. 154(b) by 0 days.

(21) Appl. No.: 17/003,255

(22) Filed: Aug. 26, 2020

(65) Prior Publication Data

US 2021/0066288 A1 Mar. 4, 2021

(51) Int. Cl.
*H01L 27/06* (2006.01)
*H01L 29/739* (2006.01)
(Continued)

(52) U.S. Cl.
CPC ........ *H01L 27/0664* (2013.01); *H01L 21/266* (2013.01); *H01L 21/26513* (2013.01); *H01L 21/308* (2013.01); *H01L 21/30604* (2013.01); *H01L 29/0696* (2013.01); *H01L 29/0821* (2013.01); *H01L 29/1095* (2013.01);
(Continued)

(58) Field of Classification Search
CPC ............. H01L 27/0664; H01L 29/0696; H01L 29/0821; H01L 29/1095; H01L 29/861; H01L 29/7395; H01L 29/66333; H01L 21/26513; H01L 21/266; H01L 21/30604; H01L 21/308; H01L 29/66136; H01L 29/7397; H01L 27/0727; H01L 29/417; H01L 29/0834; H01L 29/66348; H01L 29/66121; H01L 29/0657; H01L 29/0603; H01L 29/41708
See application file for complete search history.

(56) References Cited

U.S. PATENT DOCUMENTS 7,439,198 B2 10/2008 Schulze
8,435,863 B2 5/2013 Rahimo
(Continued)

OTHER PUBLICATIONS

Alexander et al., "Application of Embedded Metal Nanostructures for Solar Cells", International Journal of Renewable Energy Sources, vol. 1, 2016, p. 32.
(Continued)

*Primary Examiner* — David Vu
(74) *Attorney, Agent, or Firm* — Tarolli, Sundheim, Covell & Tummino LLP (57) ABSTRACT

A bipolar semiconductor device includes at least a four-layer structure, a first main side with a first electrical contact, and a second main side with a second electrical contact separated from the first main side by at least a base layer of first conductivity type. A shorting layer of the first conductivity type is arranged on the second main side of the base layer. A third layer includes a patterned highly conductive material, such as metal and/or silicides, graphene, etc., and is deposited on the shorting. A fourth layer of the second conductivity type is arranged directly on the third layer, inserted between the shorting layer and the second electrical contact. This concept can be applied to any non-punch-through or punch-through reverse conducting IGBT designs, but is particularly effective for devices using thin wafers, and is also applicable to bipolar diodes in order to improve a soft recovery process.

12 Claims, 10 Drawing Sheets

(51) Int. Cl.
　　　*H01L 29/10*　　　(2006.01)
　　　*H01L 29/06*　　　(2006.01)
　　　*H01L 29/08*　　　(2006.01)
　　　*H01L 29/861*　　(2006.01)
　　　*H01L 29/66*　　　(2006.01)
　　　*H01L 21/265*　　(2006.01)
　　　*H01L 21/266*　　(2006.01)
　　　*H01L 21/306*　　(2006.01)
　　　*H01L 21/308*　　(2006.01)

(52) U.S. Cl.
　　　CPC .. *H01L 29/66136* (2013.01); *H01L 29/66333* (2013.01); *H01L 29/7395* (2013.01); *H01L 29/7397* (2013.01); *H01L 29/861* (2013.01)

(56) References Cited

U.S. PATENT DOCUMENTS 8,508,016 B2　　8/2013　Rahimo
9,461,127 B2 *　10/2016　Zeng ................... H01L 29/0692

OTHER PUBLICATIONS

Yin et al., "Embedding Metal in the Interface of a p-n Heterojunction with a Stack Design for Superior Z-Scheme Photocatalytic Hydrogen Evolution", ACS Appl. Mater. Interfaces, 2016, 8, 35, pp. 23133-23142.

* cited by examiner

BIPOLAR SEMICONDUCTOR DEVICE AND METHOD FOR MANUFACTURING SUCH A SEMICONDUCTOR DEVICE

CROSS-REFERENCE TO RELATED APPLICATIONS

The present application claims priority to GB Patent Application No. 1912237.3 filed on 27 Aug. 2019. The entirety of this application is hereby incorporated by reference for all purposes.

TECHNICAL FIELD

The invention relates to the field of power semiconductor devices, such as a method for manufacturing a bipolar semiconductor device and a design for a bipolar semiconductor device.

BACKGROUND

One of the most recent developments in power semiconductor devices is the integration of diode functionalities such as for Reverse Conducting IGBTs. This is needed in order to eliminate the need for additional freewheeling diodes in parallel with the transistors in power electronic converter applications. The reverse conducting capability has been enabled by modern advances in design and processing of the backside of semiconductor substrates. For example, U.S. Pat. No. 8,435,863 discloses a method of creating various bipolar punch-through semiconductor devices with multiple layers, at least one layer having alternating dopant regions including at least one first region of the first conductivity type and at least one second region of the second conductivity type.

The previously described prior art is based on a manufacturing method comprising providing a thick substrate of a first conductivity type; completing the process for establishing the first side structures and then thinning the substrate from the second side to the desired final thickness, implanting or depositing particles of the first conductivity type on the second main side to create a first region; depositing a patterned metal mask layer on the second side and etching through the metal mask openings to remove portions of the first region, implanting or depositing particles of a second conductivity type on the second main side to create second regions in the metal mask openings. Then both first regions and second regions are annealed at the required temperatures to activate the dopants.

As the above process is complex especially for thin wafer processing, it is thus desirable to identify simpler and more efficient methods to create electrically shorted collector regions applicable to all types of reverse conducting bipolar semiconductors (punch-through as well as non-punch-through).

SUMMARY

It may be an object of the present invention to provide a novel concept for manufacturing a reverse conducting bipolar semiconductor using an innovative collector shorting method which eliminates the need for deep or shallow diffused, i.e. several or less than several microns thick, and highly doped alternating P+ and N+ regions.

These objects may be met by the subject matter of the independent claims. Embodiments of the invention are described with respect to the dependent claims.

An exemplary method is disclosed for manufacturing a bipolar semiconductor device with a semiconductor substrate, having at least a two-layer structure with layers of a first and a second conductivity type, a first main side, and a second main side, wherein the first layer in the two-layer structure is a first base layer of the first conductivity type, wherein the first main side is arranged opposite of the second main side, wherein a first electrical contact is arranged on the first main side, wherein a second electrical contact is arranged on the second main side, wherein a second layer of the first conductivity type can be arranged on the first base layer on the second main side (can also act as buffer or field stop in case of a punch-through device), which second layer has a higher doping concentration than the base layer, wherein a patterned third layer is arranged in direct contact with the second layer, the third layer having high conductivity similar to metals or graphene, wherein a fourth layer of a second conductivity type is arranged between the third layer and the second electrical contact. The manufacturing method comprises applying a layer or a stack of layers of high conductivity type materials (metals, silicides, graphene, etc) on the second main side to create the third layer; structuring the third layer though a mask; and applying a fourth layer of the second conductivity type on the second main side in direct contact with the third layer to create first and second type regions. First type regions are regions in which the PN junction is shorted, i.e. a minimum three-layer structure is being used: a first conductivity type layer, a metal-like third layer, and a second conductivity type layer. Second type regions are regions in which the PN junction remains functional, i.e. a minimum two-layer structure is being used: a first conductivity type layer, and a second conductivity type layer.

An exemplary bipolar semiconductor device is disclosed comprising a semiconductor substrate, having at least a two-layer structure with layers of a first and a second conductivity type, a first main side, and a second main side, wherein one of the layers is a first layer (base layer) of the first conductivity type, wherein the first main side is arranged opposite of the second main side, wherein a first electrical contact is arranged on the first main side, wherein a second electrical contact is arranged on the second main side, wherein a second layer of the first conductivity type is arranged on the first base layer on the second main, which second layer has a higher doping concentration than the first base layer (can also act as buffer or field stop in case of a punch-through device), wherein a patterned third layer is arranged in direct contact with the second layer of the first conductivity type, the third layer having high conductivity similar to metals or graphene, wherein a fourth layer of a second conductivity type is arranged between the third layer and the second electrical contact.

With this method, an inventive RC-IGBT can be provided with good control for the integrated diode part while reducing or eliminating overshooting of the current during reverse recovery of the diode due to additional hole injection. The layers can be made thin, so that the manufacturing can be performed with thin wafers (e. g. below 300 µm) and, as the final semiconductor devices can also be made thin, such devices are especially suitable for low voltages, e.g. below 2000 V.

Further preferred embodiments of the inventive subject matter are disclosed in the dependent claims.

BRIEF DESCRIPTION

The embodiments of the invention will be explained in more detail in the following text with reference to the attached drawings, in which.

The reference symbols used in the figures and their meaning are summarized in the list of reference symbols. The drawings are only schematically and not to scale. Generally, alike or alike-functioning parts are given the same reference symbols. The described embodiments are meant as examples and shall not confine the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure (s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

Unless otherwise defined, all terms (including technical and scientific terms) used herein have the same meaning as commonly understood by one of ordinary skill in the art to which example embodiments belong. It will be further understood that terms, e. g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

In this specification, N-doped is referred to as first conductivity type while P-doped is referred to as second conductivity type. Alternatively, the semiconductor devices can be formed with opposite doping relations so that the first conductivity type can be P-doped and the second conductivity type can be N-doped. Furthermore, some Figures illustrate relative doping concentrations by indicating "−" or "+" next to the doping type. For example, "N−" means a doping concentration which is less than the doping concentration of an "N"-doping region while an "N+"-doping region has a larger doping concentration than the "N"-doping region. However, indicating the relative doping concentration does not mean that doping regions of the same relative doping concentration have to have the same absolute doping concentration unless otherwise stated. For example, two different N+-doping regions can have different absolute doping concentrations. The same applies, for example, to an N+-doping and a P+-doping region.

Specific embodiments described in this specification pertain to, without being limited thereto, reverse conducting bipolar semiconductor devices.

When referring to semiconductor devices, at least two-terminal devices are meant, an example is a diode. Semiconductor devices can also be three-terminal devices such as a field-effect transistors (FETs), insulated gate bipolar transistors (IGBTs), junction field effect transistors (JFETs), and thyristors to name a few. The semiconductor devices can also include more than three terminals.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e. g. "between" versus "directly between", "adjacent" versus "directly adjacent," etc.).

A method is disclosed for manufacturing a bipolar semiconductor device, which can have better electrical properties and provide better control compared to known bipolar punch-through and non-punch through semiconductor devices. A bipolar semiconductor device is also disclosed.

In an exemplary method, a bipolar non-punch-through semiconductor device with a semiconductor substrate is manufactured. The substrate comprises depending on the semiconductor type at least a two-layer structure with layers of a first and a second conductivity type, one of the layers being a first base layer (1) of the first conductivity type. The substrate comprises a first main side (31) (e.g., emitter side), on which a first electrical contact is arranged (30), and a second main side (21) (e.g., collector side), on which a second electrical contact is arranged (21). The first main side (31) is arranged opposite of the second main side (21). A second layer (5) of the first conductivity type is arranged on the base layer on the second main side (21), which second layer (5) have a higher doping concentration than the base layer (1). A third layer (6) can be arranged in the substrate on the second side of the second layer (5). The third layer (6) comprises highly conductive regions including but not limited to metals, silicides, or graphene. A fourth layer (7) of a second conductivity type is subsequently arranged between the third layer (6) and the second electrode (20), in direct contact with the second layer (5) in a punch through device or to the first base layer (1) in a non-punch through device. The sixth buffer layer of the first conductivity type (2) can also be arranged on the second side (21) between the first base layer (1) and fourth layer (7).

Figure 1A:
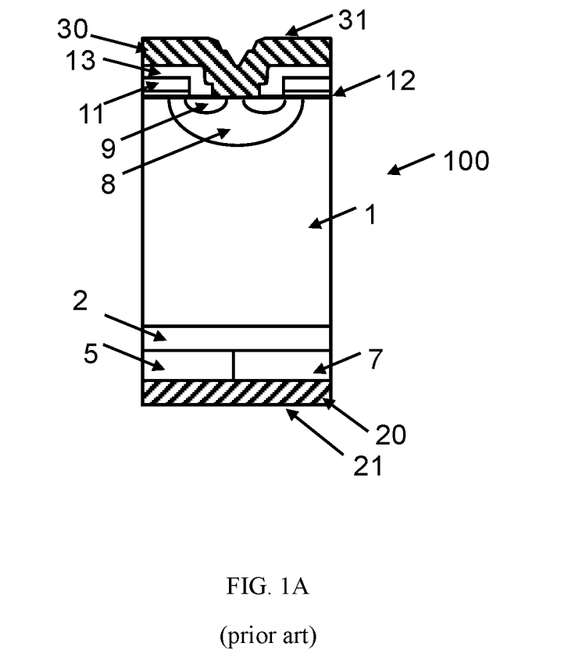
FIG. 1A-B: shows the cross sections of a RC-IGBT device according to prior art (A) and according to the invention (B).
Figure 1B:
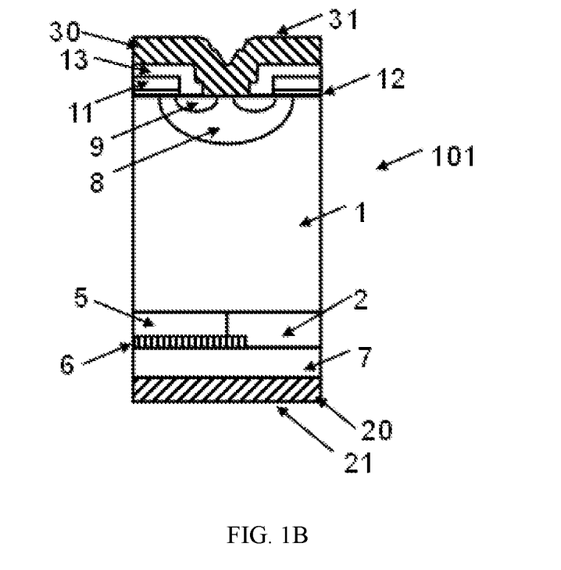
Figure 2:
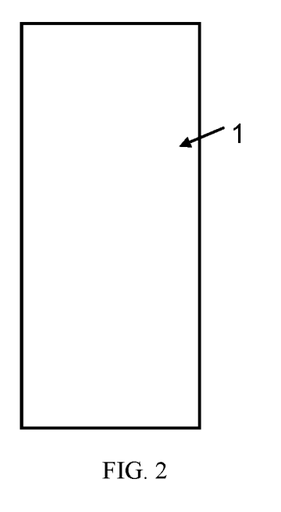
FIG. 2-8: show the method of manufacturing for a RC-IGBT according to the first embodiment.
Figure 3:
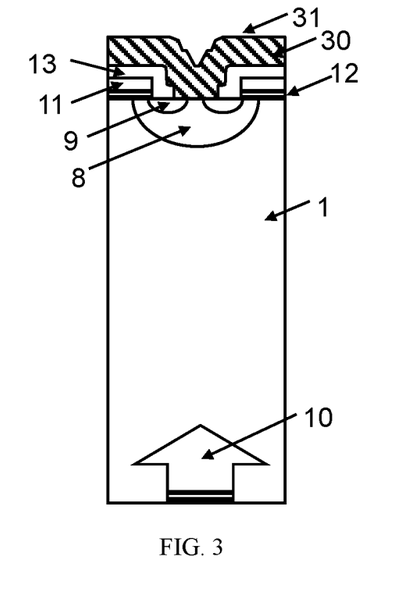
Figure 4:
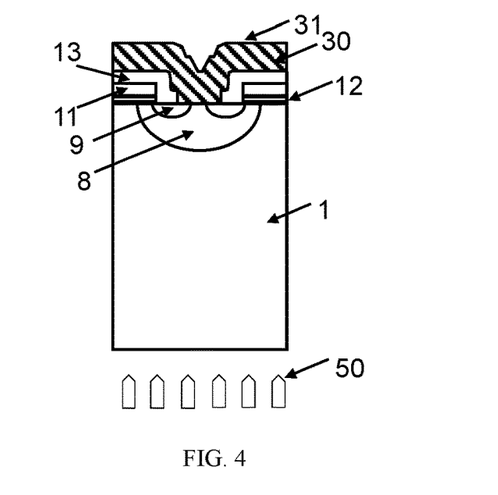
Figure 5:
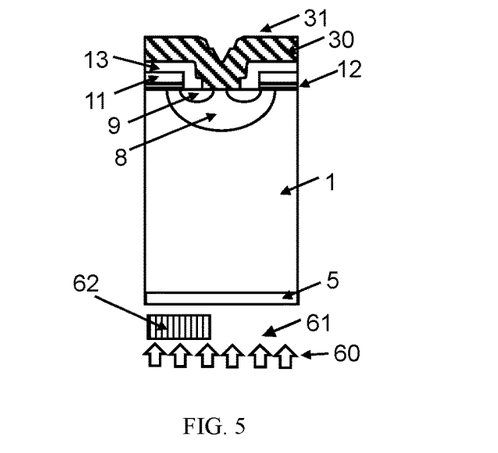
Figure 6:
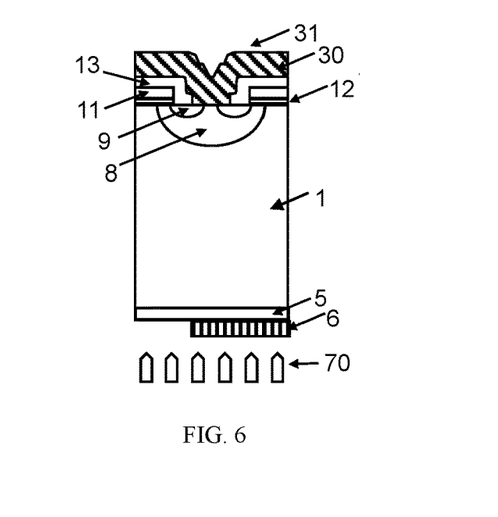
Figure 7:
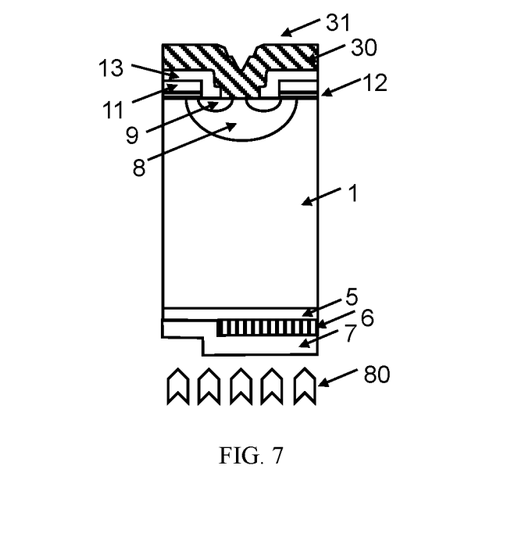

Another exemplary embodiment is directed to a manufacturing method for the bipolar semiconductor device, the manufacturing method comprising:

starting with a substrate (1) of a first conductivity type, and large thickness as depicted in FIG. 2, completing the processing of the first side (31) by using a known set of processes to those skilled in the art as shown in FIG. 3, thinning the wafer on the backside as indicated by the arrow (10) in FIG. 3, implanting particles of the first conductivity type or depositing a pre-doped layer of the first conductivity type on the second main side to create a shorting layer (5) as depicted by arrows (50) in FIG. 4, introducing a thin metal layer (6) (or stack) on the second main side (21) as indicated by arrows (60) in FIG. 5, directly via a shadow mask (62), or by depositing a uniform layer followed by a standard photolithography and etch process, depositing a pre-doped thin layer of amorphous silicon of a second conductivity type (7) on the second main side (21), or an undoped thin layer of amorphous silicon (arrows 70 in FIG. 7). Amorphous silicon can also be subsequently doped by particles of the second conductivity type, activating the backside layers by laser annealing on the second side (21), depositing the backside metal stack (20) on top of the amorphous silicon layer (7) according to known processes to those skilled in the field (arrows 80 in FIG. 7), activating the backside layers at low temperatures below 400° C. to achieve the final device shown in FIG. 8.

Figure 9:
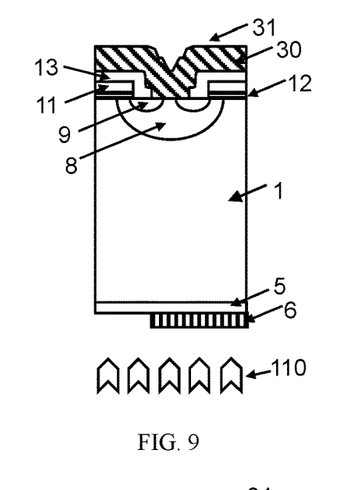
FIG. 9-13: show the method of manufacturing for a RC-IGBT according to a second embodiment.
Figure 10:
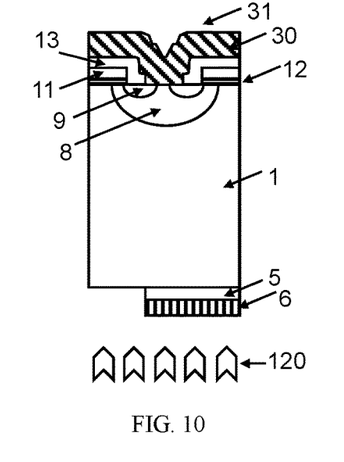
Figure 11:
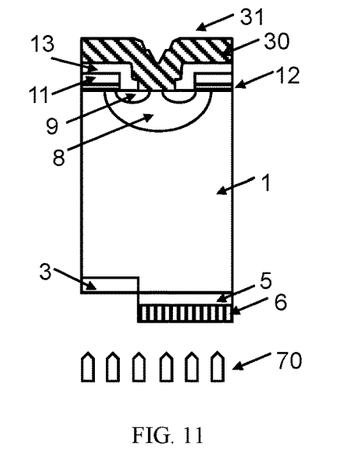
Figure 12:
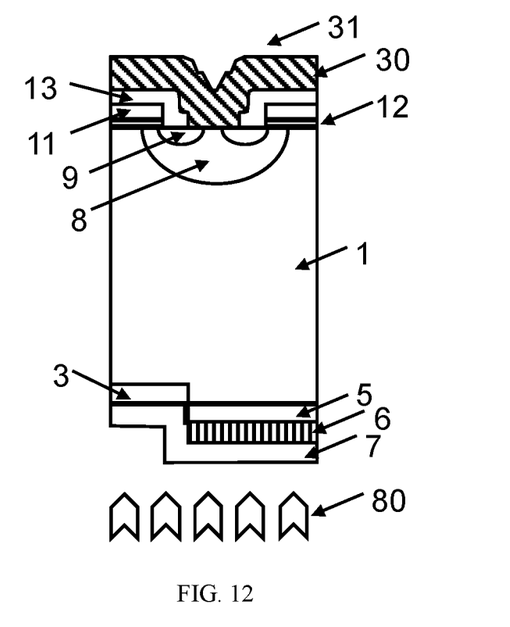

In yet another exemplary embodiment directed to a manufacturing method for the bipolar semiconductor device, the manufacturing method comprises:

starting with a substrate of a first conductivity type, and large thickness as depicted in FIG. 2, completing the processing of the first side (31) by using a known set of processes to those skilled in the art as shown in FIG. 3, thinning the wafer on the backside as indicated by the arrow (10) in FIG. 3, implanting particles of the first conductivity type or depositing a pre-doped layer of the first conductivity type on the second main side to create a shorting layer (5) as depicted by arrows (50) in FIG. 4, introducing a thin metal layer (6) (or stack) on the second main side (21) as indicated by arrows (60) in FIG. 5, directly via a shadow mask (62), or by depositing a uniform layer followed by a standard photolithography and etch process, etching the silicon substrate on the second main side (21) to remove the shorting layer (5) of first conductivity type from the regions which are not covered by the metal layer as indicated by the arrows (110) in FIG. 9, implanting or depositing particles of the second conductivity type through the thin metal layer openings on the second main side (21) as shown by arrows (120) in FIG. 10 to form the fifth layer (3), depositing a pre-doped thin layer of amorphous silicon of a second conductivity type (7) on the second main side (21), or an undoped thin layer of amorphous silicon (arrows 70 in FIG. 11). Amorphous silicon can also be subsequently doped by particles of the second conductivity type, activating the backside layers by laser annealing on the second side (21), depositing the backside metal stack (20) on top of the amorphous silicon layer (7) according to known processes to those skilled in the field (arrows 80 in FIG. 12), activating the backside layers at low temperatures below 400° C. to achieve the final device shown in FIG. 13.

The operating mechanism is based on the principle that the highly conductive layer (6) is arranged at the interface between oppositely doped layers (5) and (7), enabling the integrated diode functionality i.e. unrestricted flow of electrons between the layer (1) and the electrode (20). The rest of the PN interface between the layers (5) and (7) which is not covered by the layer (6), enables the actual IGBT part to be formed. The top side of the IGBT structure is indicated for exemplification purposes as a planar cell design, however it is understood that other features are also included in the embodiment, such as trench-based designs, or enhancement layers. Furthermore, the cells can have any shape like a square, rectangular or a circle or any other regular or irregular shape.

Figure 8:
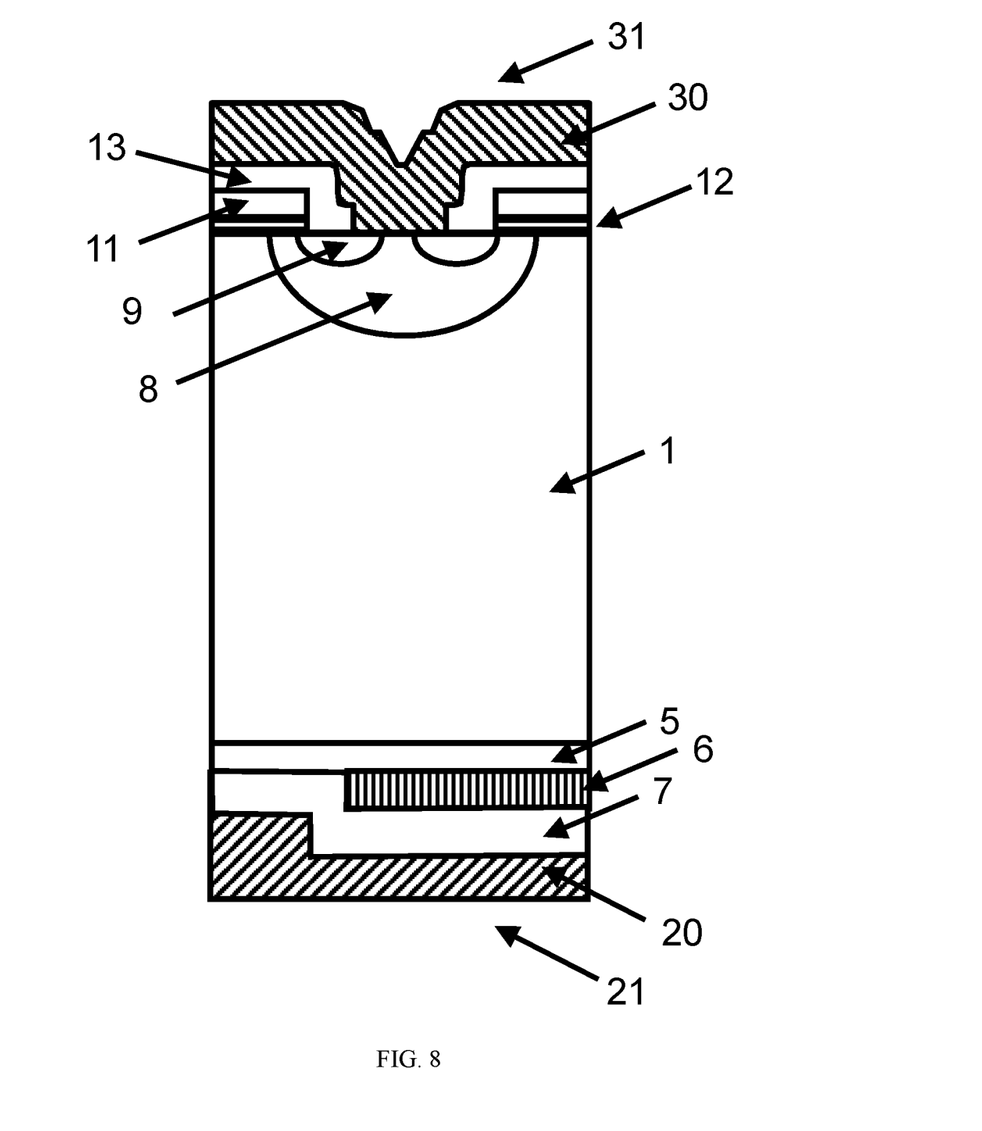
Figure 13:
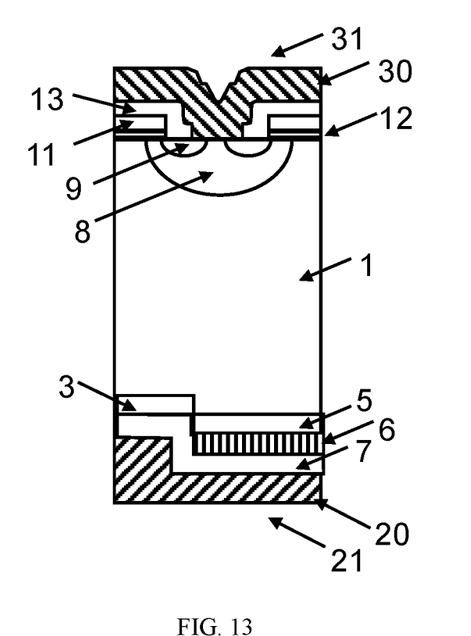

For an IGBT design with a gate electrode formed as planar gate electrode (11) as shown is FIGS. 8 and 13, a first electrically insulating region (12) is arranged on top of the first main side (31). In between the first and second electrically insulating regions (12), (13), the gate electrode (11) is embedded, and for example can be completely surrounded between these insulating regions. Thus, the gate electrode (11) is separated from the base layer (1), the P-doped layer (8), and the source regions (9) by the first electrically insulated region (11). The gate electrode (11) can be made of a heavily doped polysilicon or a metal like aluminum.

The at least one source region (9), the gate electrode (11) and the electrically insulating layers (12) and (13) are formed in such a way that an opening is created above the P-doped layer (8). The opening is surrounded by the at least one source region (9), the gate electrode (11) and the electrically insulating layers (12) and (13).

A first electrical contact (30) is arranged on the first main side within the opening so that it is in direct electrical contact to the P-doped layer (8) and the source regions (9). This first electrical contact (30) can also cover the electrically insulating layer (13), but is separated and thus electrically insulated from the gate electrode (11) by the second electrically insulating region (13).

The IGBT further comprises a shorting layer (5) which can also act as buffer layer in a punch-through design. The shorting layer has a higher doping than the base layer (1) and is arranged on the base layer (1) towards the second side (21). A highly conductive layer (6) is deposited and patterned on the shorting layer (5) towards the second side (21) leaving exposed areas on layer (5). A layer (7) of a second conductivity type is arranged to uniformly cover the layer (6) and the exposed areas of the layer (5), and is in direct contact with the second electrical contact (20).

In an exemplary reverse-conducting IGBT of the present disclosure, a diode is formed between the first electrical contact (30), which forms an anode electrode of the diode, the P-doped layer (8), part of which forms an anode layer of the diode, the base layer (1), part of which forms a base layer in the diode, the shorting layer (5) which can also act as a buffer layer in punch-through designs, the highly conductive layer (6), which forms a cathode layer by short-circuiting the PN junction between the highly oppositely doped layers (5) and (7), and the second electrical contact (20), which forms a cathode electrode.

In the exemplary reverse-conducting IGBT of the present disclosure, an insulating bipolar transistor (IGBT) is formed between the first electrical contact (30), which forms an emitter electrode in the IGBT, the source region (9), the P-doped layer (8), part of which forms a channel region, the base layer (1), part of which forms a base region in the IGBT, the layer (5) which can also act as a buffer layer in punch-through designs, the layer (7), which forms a collector layer, and the second electrical contact (20), which forms a collector electrode.

Figure 14:
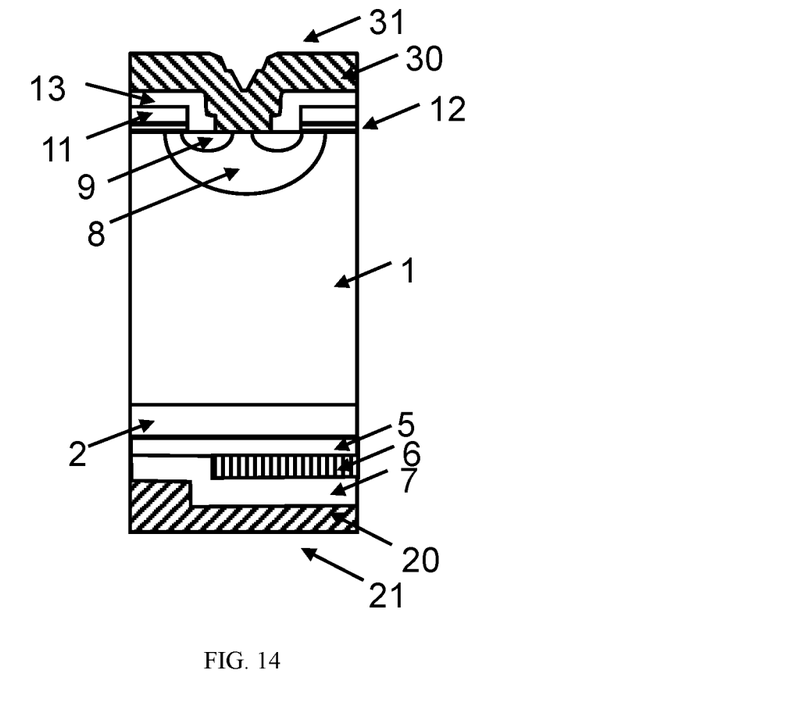
FIG. 14: shows a punch-through RC-IGBT device with a buffer layer.

FIGS. 8 and 13 depict a first and second embodiment for a thin punch through and non-punch-through reverse conducting IGBT respectively. The layer (5) in FIG. 8, which is used as a shorting layer being in direct contact with the highly conductive layer (6) can also be used as a buffer in the first embodiment. However, for a punch-through reverse conducting IGBT with optimal performance, an additional sixth buffer layer of the first conductivity type (2) is needed to further reduce the thickness of the bipolar semiconductor, FIG. 14 shows a third embodiment for a bipolar punch-through reverse conducting IGBT. This layer (2) can be pre-formed in the thick substrate (1) before thinning, or is formed by epitaxial growth or by single or multiple implantation processes subsequent to the substrate thinning process. The sixth buffer layer (2) has a doping concentration of, for example, at maximum $10^{17}$ atoms/cm$^3$.

Figure 15:
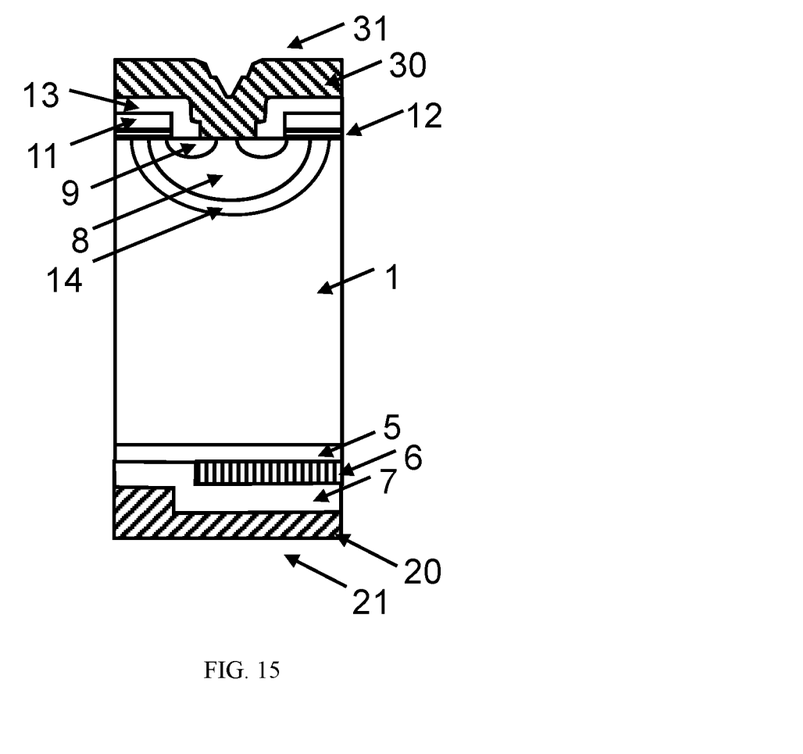
FIG. 15: shows a RC-IGBT with planar cell design and enhancement layer.

The FIG. 15 shows a fourth embodiment for a reverse conducting IGBT using a planar top cell structure as described in the first embodiment, together with an additional enhancement layer (14) of a first conductivity type arranged between the P-doped layer (8) and the substrate (1), that contributes to achieving an optimal shape of the minority charge carriers modulating the conductivity in the substrate (1). Thus, lower on-state conduction losses can be achieved in the bipolar semiconductor.

Figure 16:
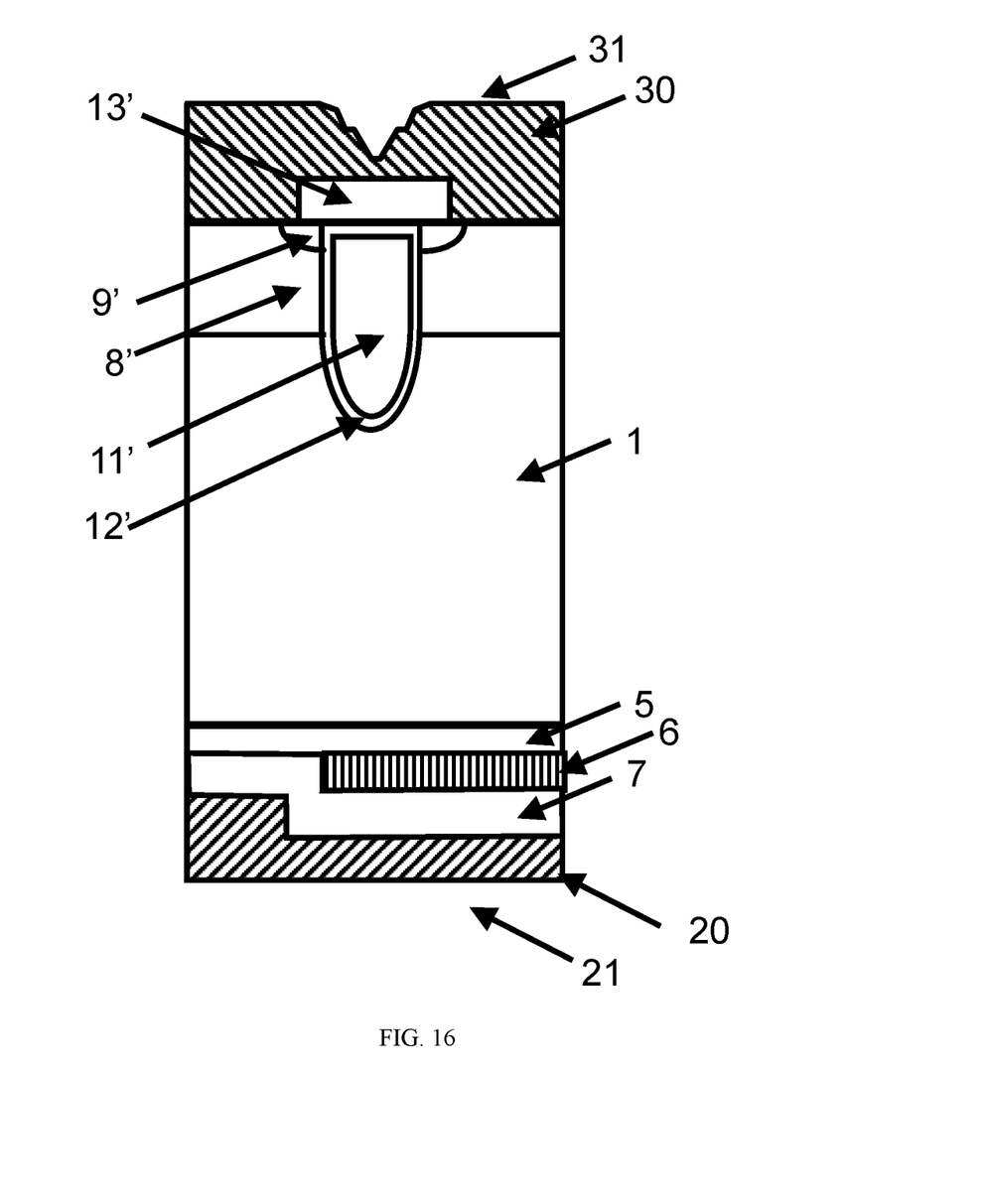
FIG. 16: shows a RC-IGBT with trench cell design.

As mentioned above, although the embodiments one thru four are shown as using a planar type of IGBT cell, it is also possible to apply this invention to trench-based designs. By means of exemplification, and not limited to only this representation, FIG. 16 shows a fifth possible embodiment for a reverse conducting IGBT using a trench-based cell design. The trench gate electrode (11') is arranged in the same plane as the P-doped layer (8') and adjacent to the source regions (9'), separated from each other by a first insulating region (12'), which also separates the gate electrode (11') from the base layer (1). A second insulating region (13') is arranged on top of the gate electrode formed as a trench gate electrode, thus insulating the trench gate electrode (11') from the first electrical contact (30).

The IGBT further comprises a shorting layer (5) which can also act as buffer layer in a punch-through design. The shorting layer has a higher doping than the base layer (1) and is arranged on the base layer (1) towards the second side (21). A highly conductive layer (6) is deposited and patterned on the shorting layer (5) towards the second side (21) leaving exposed areas on layer (5). A layer (7) of a second conductivity type is arranged to uniformly cover the layer (6) and the exposed areas of the layer (5), and is in direct contact with the second electrical contact (20). Similar to the planar cell design in FIG. 15, an additional enhancement layer can also be applied to the structure in FIG. 16 (not shown in the Figure).

Figure 17:
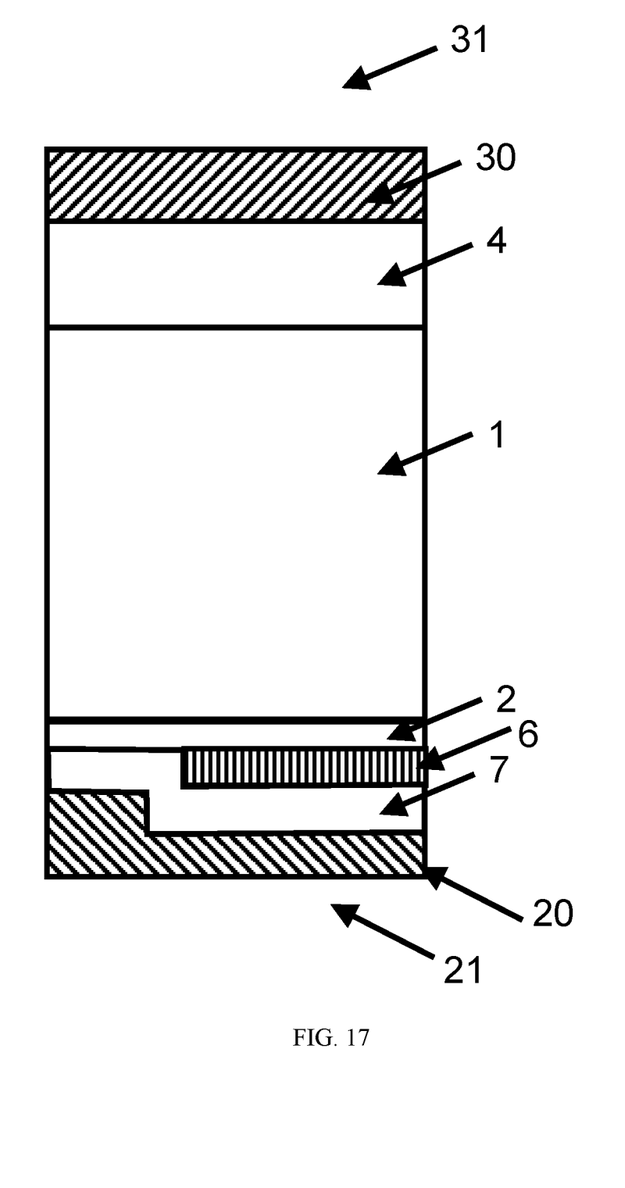
FIG. 17: Shows a concept for a soft reverse recovery fast diode with "Field Charge Extraction" regions at the cathode side.

Finally, the FIG. 17 shows a sixth exemplary embodiment for a fast recovery power diode. The diode comprises a base layer (1) of a first conductivity type, with a first main side (31) and a second main side (21) opposite the first main side (31). A layer (4) of a second conductivity type is arranged on the first main side (31). A first electrical contact (30), in form of a metal layer, for example, is arranged on top of the layer (4), i.e. on that side of the second layer (4), which lies opposite the base layer (1). A sixth buffer layer (2) is arranged on the second main side (21). This sixth buffer layer (2) has a higher doping concentration than the base layer (1). A highly conductive layer (6) is arranged on the sixth buffer layer (2) in direct electrical contact with the buffer layer, and structured so as to not fully cover the sixth buffer layer (2). A layer (7) of a second conductivity type is arranged in direct electrical contact with the layers (2) and (6) on the side which lies towards the first main side (21), and in direct electrical contact with the second electrical contact (20) which lies towards the second main side (21). The operating mechanism of this structure is as follows. During the final stages of the reverse recovery process, electrons will flow near the PN junction between oppositely doped layers (2) and (7), towards the low resistance path created by the metal-like layer (6). This results in an increased lateral voltage drop at the PN junction which will exceed the built-in voltage of the junction, hence causing hole injection from the layer (7). The injected or induced holes will provide charge for soft performance during the latest stages of reverse recovery independent of the device base region and buffer design parameters. In forward bias mode, the diode operation remains unchanged as the electrons can flow from the electrode (20), through the layer (7) (acting as a simple highly doped resistor) and through the layer (6) towards the drift region of the diode (1) where they will recombine with holes when reaching the layer (4).

REFERENCE LIST

1: first substrate/drift layer of first conductivity type
2: sixth buffer layer of first conductivity type
20: second side metallization (electrode)
21: second main side
3: fifth layer of second conductivity type
30: first side metallization (electrode)
31: first main side
4: P-doped anode in diode
5: second N-doped layer used for shorting purposes
6: third layer of highly conductive material
7: fourth layer of second conductivity type
8, 8': P-base layers in IGBT
9, 9': N+ source layers
10: wafer thinning process
11, 11': gate electrodes, electrically conductive layers
12, 12': insulating gate oxide in IGBT
13, 13': insulation layers
14: enhancement layer of first conductivity type
50: implantation or deposition of first conductivity type dopant
60: deposition of highly conductive layer (metal, silicides, graphene)
70: deposition of amorphous silicon
80: deposition of second main side metallization
100: Reverse-conducting IGBT according to prior art
101: Reverse-conducting IGBT according to this invention
110: etching step
120: implantation of second conductivity type dopant

What is claimed is:
1. A bipolar semiconductor device comprising:
a semiconductor substrate, having at least a two-layer structure with layers of a first and a second conductivity type, a first main side, and a second main side, wherein one of the layers is a first base layer of the first conductivity type, wherein the first main side is structured as a MOS cell with planar gates, and arranged opposite of the second main side, wherein a first electrical contact is arranged on the first main side, wherein a second electrical contact is arranged on the second main side, wherein a second shorting layer of the first conductivity type is arranged on the first base layer on the second main side, the second shorting layer has a higher doping concentration than the first base layer, wherein a patterned third layer of high conductivity material is deposited/grown on the second shorting layer towards the second main side, and wherein a fourth layer of the second conductivity type is arranged between the third layer and the second electrical contact.

2. The bipolar semiconductor device according to claim 1, wherein a fifth layer of the second conductivity type is arranged in the base layer on the second main side, in the regions that are not covered by the third layer, and wherein the fourth layer of the second conductivity type is arranged between the third and the fifth layers in the direction of the first main side, and the second electrical contact in the direction of the second main side.

3. The bipolar semiconductor device according to claim 1, wherein the MOS cell arrangement of layers on the first main side has a geometrical shape of one of circular, rectangular, hexagonal cells or stripes.

4. The bipolar semiconductor device according to claim 1, wherein a sixth buffer layer of the first conductivity type is arranged on the first base layer on the second main side, the sixth buffer layer has a higher doping concentration than the first base layer, wherein the second shorting layer of the first conductivity type is arranged on the sixth buffer layer on the second main side, which second shorting layer has a higher doping concentration than the first base layer and the sixth buffer layer, and wherein the fourth layer of the second conductivity type is arranged between the third layer and the second electrical contact.

5. The bipolar semiconductor device according to claim 4, wherein the sixth buffer layer has a doping concentration of at most $10^{17}$ cm$^{-3}$.

6. The bipolar semiconductor device according to claim 1, wherein the MOS cell on the first main side comprises an arrangement of trench gates in addition to, or instead of, planar gates.

7. The bipolar semiconductor device according to claim 1 wherein an enhancement layer of the first conductivity type is used in the first main side of the substrate between the seventh base layer of second conductivity type and the first base layer of first conductivity type.

8. The bipolar semiconductor device according to claim 1, wherein the bipolar semiconductor device is a bipolar diode.

9. The bipolar semiconductor device according to claim 1, wherein the third layer is formed as a multi-layered structure of high conductivity materials.

10. The bipolar semiconductor according to claim 1, wherein the third high conductivity layer is formed of multiple segments, wherein the shape of each segment is a square, rectangle, circle, or an irregular shape.

11. A bipolar diode, comprising:
a semiconductor substrate, having at least a two-layer structure with layers of a first and a second conductivity type, a first main side, and a second main side, wherein one of the layers is a first base layer of the first conductivity type,
wherein the first main side is arranged opposite of the second main side,
wherein a first electrical contact is arranged on the first main side,
wherein a second electrical contact is arranged on the second main side,
wherein a sixth buffer layer of the first conductivity type is arranged on the first base layer on the second main side, which sixth buffer layer has a higher doping concentration than the first base layer,
wherein a patterned third high conductivity layer is arranged on the sixth buffer layer on the second main side, and
wherein a fourth layer of the second conductivity type is arranged between the sixth buffer layer and the third highly conductive layer on one side, and the second electrical contact on the other side.

12. The bipolar diode according to claim 11, wherein the segments of the third high conductivity layer are arranged in a cell design and/or as a stripe design across the semiconductor substrate.

* * * * *

UNITED STATES PATENT AND TRADEMARK OFFICE
CERTIFICATE OF CORRECTION

PATENT NO. : 11,264,376 B2
APPLICATION NO. : 17/003255
DATED : March 1, 2022
INVENTOR(S) : Munaf Rahimo It is certified that error appears in the above-identified patent and that said Letters Patent is hereby corrected as shown below:

On the Title Page

Insert Item (30): Foreign Application Priority Data: --GB 1912237.3 filed on August 27, 2019--

Signed and Sealed this
Seventeenth Day of May, 2022

Katherine Kelly Vidal
*Director of the United States Patent and Trademark Office*